(12) United States Patent
Oda

(10) Patent No.: US 7,813,468 B2
(45) Date of Patent: Oct. 12, 2010

(54) COUNTER CIRCUIT

(75) Inventor: Yasuhiro Oda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/320,828

(22) Filed: Feb. 5, 2009

(65) Prior Publication Data
US 2009/0231017 A1    Sep. 17, 2009

(30) Foreign Application Priority Data
Mar. 11, 2008    (JP)    ............... 2008-060834

(51) Int. Cl.
*H03K 23/00*    (2006.01)
(52) U.S. Cl. .................. 377/118; 377/44; 377/124
(58) Field of Classification Search .................. 377/44, 377/107, 118, 119, 124
See application file for complete search history.

(56) References Cited

U.S. PATENT DOCUMENTS

| 5,136,588 | A | * | 8/1992 | Ishijima | ............... | 714/701 |
|---|---|---|---|---|---|---|
| 5,226,063 | A | * | 7/1993 | Higashitsutsumi | ........... | 377/44 |
| 5,600,695 | A | * | 2/1997 | Negi | ........................ | 377/51 |
| 6,085,343 | A | * | 7/2000 | Krishnamoorthy | .......... | 714/724 |
| 6,556,645 | B2 | * | 4/2003 | Kim | ........................ | 377/51 |
| 7,609,801 | B2 | * | 10/2009 | Park et al. | ................. | 377/52 |
| 2003/0231736 | A1 | * | 12/2003 | Yamamura | ................. | 377/118 |

FOREIGN PATENT DOCUMENTS

JP    4-287420    * 10/1992
JP    11-39170    2/1999

* cited by examiner

*Primary Examiner*—Tuan Lam
(74) *Attorney, Agent, or Firm*—McGinn IP Law Group, PLLC

(57) ABSTRACT

Reduction in power consumption of a counter circuit for continuous operation is demanded. Therefore, provided is a counter circuit including: a first counter of m bits for counting and storing a value of a predetermined bit width according to an input clock; a clock transmission control circuit for controlling whether to transmit the input clock based on a value output according to a counting result of the first counter; and a second counter of n bits for counting and storing another value of the predetermined bit width according to the input clock transmitted from the clock transmission control circuit.

9 Claims, 16 Drawing Sheets

US 7,813,468 B2

COUNTER CIRCUIT

BACKGROUND OF THE INVENTION

1. Field of the Invention

The present invention relates to a counter circuit.

2. Description of the Related Art

Power saving is increasingly demanded for an LSI used for a mobile phone or the like. A method such as clock gating is used to save power for a circuit such as an LSI. Japanese Patent Application Laid-open No. Hei 11-39170 discloses a technology regarding a counter circuit which uses such clock gating.

FIG. 18 illustrates a counter circuit 1 of Japanese Patent Application Laid-open No. Hei 11-39170 where a counter has a 4-bit configuration. As illustrated in FIG. 18, the counter circuit 1 includes a counter unit 10 and a prohibiting gate 40. The counter unit 10 includes flip-flops FF11 to FF14 and an adder 20.

The flip-flops FF11 to FF14 latch 4 bits of input count values count_in[0] to count_in[3] in synchronization with a clock CLK, and output the latched values as output count values count[0] to count[3]. The adder 20 adds "1" to the output count values count[0] to count[3], and inputs the added values as input count values count_in[0] to count_in[3] to the flip-flops FF11 to FF14 again.

The prohibiting gate 40 controls outputting of the clock CLK to a clock input terminal of the flip-flops FF11 to FF14 based on a value of an input enable signal Enable.

However, the circuit such as the counter circuit 1 can only control whether to prohibit input of the clock CLK from the prohibiting gate 40 to the flip-flops FF11 to FF14. Thus, for example, when a value of the enable signal Enable is always "1", the circuit cannot stop the input of the clock CLK to the flip-flops FF11 to FF14.

In such a counter circuit 1, in the case of processing a count value of a greater number of bits, all the included flip-flops receive the clock CLK to be operated. Thus, for example, the flip-flop that outputs a value of a 4-th bit and the flip-flop that outputs a value of a one-digit higher bit, i.e., 5-th bit, receive the same clock CLK to be operated. In other words, the same clock is supplied to flip-flops greatly different from each other in operation probability between lower and higher digits. As a result, more flip-flops are operated by the clock CLK as a count digit number is greater, causing a problem of an increase in power consumption.

SUMMARY

The present invention provides a counter circuit adding a first value indicated by a plurality of bits and a second value in response to a clock signal, a first part of said plurality of bits being lower than a second part of said plurality of bits, said counter circuit including a first counter adding said first part of said plurality of bits and said second value in response to said clock signal to output a third value regarding a result of adding said first and said second values;

a second counter adding said second part of said plurality of bits and a fourth value indicated by a carry-out signal from said first counter in response to said clock signal; and a clock transmission control circuit coupled to said first and second counters and receiving said clock signal and said third value to control whether or not to supply said clock signal to said second counter in accordance with said received third value.

The counter circuit of the present invention enables reduction of a ratio of an input clock operation of the second counter which is a higher-bit counter with respect to the first counter which is a lower-bit counter.

According to the present invention, power consumption of the counter circuit can be reduced.

BRIEF DESCRIPTION OF THE DRAWINGS

The above and other objects, advantages and features of the present invention will be more apparent from the following description of certain preferred embodiments taken in conjunction with the accompanying drawings, in which.

In the accompanying drawings.

DETAILED DESCRIPTION OF THE PREFERRED EMBODIMENTS

Figure 1:
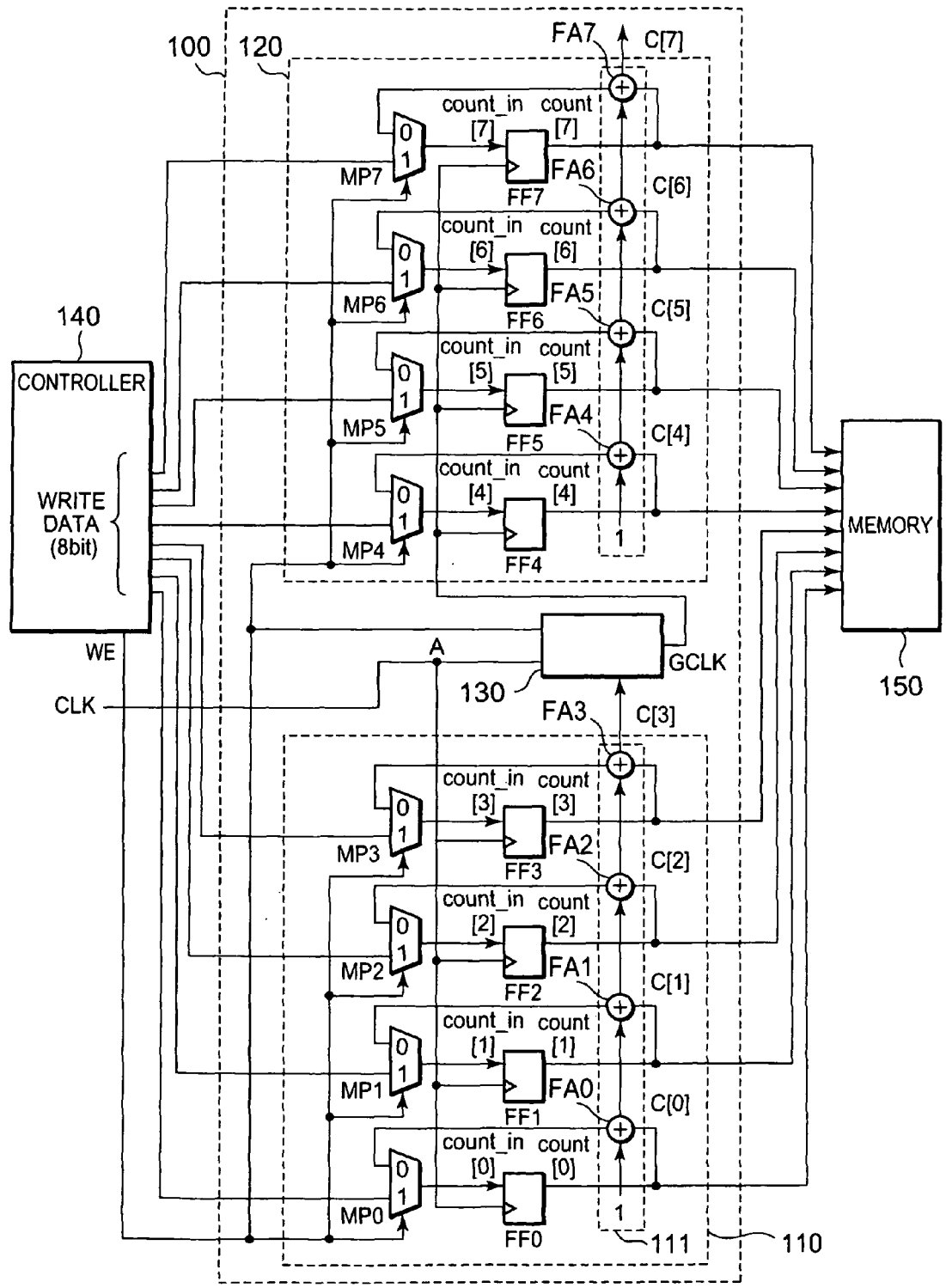
FIG. 1 illustrates a configuration of a counter circuit according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Referring to the drawings, a specific first embodiment of the present invention is described below in detail. According to the first embodiment, the present invention is applied to a counter circuit 100 of an 8-bit width. In this case, the counter circuit 100 is used as an address counter of a memory.

FIG. 1 illustrates an example of a configuration of the counter circuit 100 according to this embodiment. As illustrated in FIG. 1, the counter circuit 100 includes a counter 110 (first counter), a counter 120 (second counter), and a clock transmission control circuit 130. The counter circuit 100 receives 8-bit write data and a write enable signal WE from a controller 140. The counter circuit 100 outputs an 8-bit output count value count[7:0] to a memory 150.

The counter 110 is a counter of a 4-bit configuration. A value output from the counter 110 is equal to lower 4 bits of the 8-bit output count value count[7:0] output from the counter circuit 100. An output count value of the counter 110 is accordingly count[3:0]. The counter 110 includes flip-flops FF0 to FF3, an addition circuit 111, and multiplexers MP0 to MP3.

The flip-flops FF3 to FF0 respectively receive values count_in[3] to count_in[0] of digit bits of a 4-bit count value. The flip-flops FF3 to FF0 latch the values of count_in[3] to count_in[0] in synchronization with an input clock CLK to output the values as count[3] to count[0]. The value of count[0] output from the flip-flop FF0 is a least significant bit of the 4-bit count value, while the value of count[3] output from the flip-flop FF3 is a most significant bit of the 4-bit count value.

The addition circuit 111 includes full adders FA0 to FA3. The addition circuit 111 receives the output values count[3] to count[0] of the flip-flops FF3 to FF0, and adds "1". The addition circuit 111 outputs the added values to the multiplexers MP3 to MP0. When the value of count[3:0] is "1111" ("15" of decimal number), the addition circuit 111 outputs a value of "0000" to the multiplexers MP3 to MP0, and a carry-out signal C[3] of a value of "1" to the clock transmission control circuit 130.

The detailed configuration of the addition circuit 111 and the outputting operation of the carry-out signal C[3] of the addition circuit 111 are described below in more detail. The full adders FA0 to FA3 of the addition circuit 111 receive count[3] to count[0] and carry-out signals from full adders which carry own lower bits. The full adders FA0 to FA3 output calculation results to the multiplexers MP3 to MP0, and own carry-out signals to full adders which carry upper bits. The carry-out signal that the full adder FA0 receives is always "1". The value "1" may be supplied from the controller 140, or for example, the counter 110 itself may generate the value by using a power supply voltage VDD. The carry-out signal C[3] output from the full adder FA3 is output to the clock transmission control circuit 130.

Thus, when a value of count[3:0] is "1111", the full adder FA0 adds "1" to the value "1" of count[0], and outputs a carry-out signal C[0] of the value "1" to the full adder FA1. The full adder FA1 adds the value "1" of C[0] to a value "1" of count[1], and outputs a carry-out signal C[1] of the value "1" to the full adder FA2. The full adders FA2 and FA3 are similarly operated. As a result, a carry-out signal C[3] of the value "1" is output from the full adder FA3 to the clock transmission control circuit 130.

The multiplexers MP3 to MP0 receive outputs from the full adders FA0 to FA3 by ones of their inputs, and lower 4 bits of 8-bit write data output from the controller 140 by the other inputs. The 8-bit write data output from the controller 140 is used, for example, as an initial count value of the counter circuit 100.

The multiplexers MP3 to MP0 transmit the outputs of the full adders FA0 to FA3 or the lower 4 bits of the write data as count_in[3] to count_in[0] to the flip-flops FF3 to FF0 according to a value of the write enable signal WE. According to the first embodiment, the multiplexers MP3 to MP0 transmit the lower 4 bits of the write data when the write enable signal WE is "1", and the outputs of the full adders FA0 to FA3 when "0".

Figure 2:
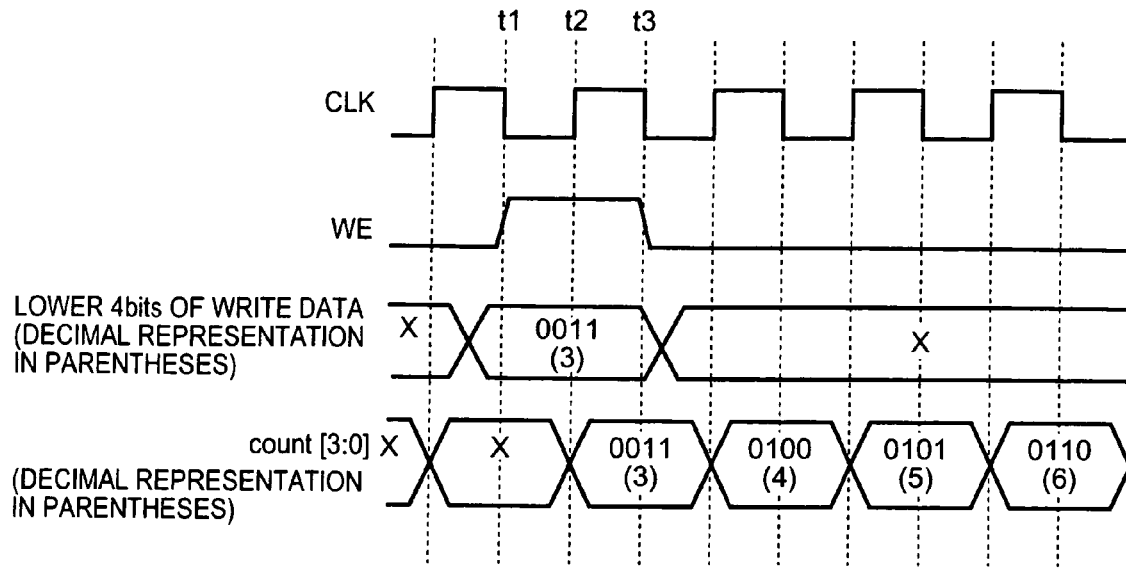
FIG. 2 is a timing chart of a counter according to the first embodiment.

FIG. 2 is a timing chart of an operation of the counter 110. This timing chart illustrates a simple relationship among the write enable signal WE, the lower 4-bit write data, and the output value count[3:0] of the counter 110. It is presumed that "0011" (decimal number "3") is input as the lower 4-bit write data from the controller 140 to the counter 110.

As illustrated in FIG. 2, at time t1, the write enable signal WE from the controller 140 becomes a high level (value "1"). The value "0011" (decimal number "3") of the write data is transmitted as count_in[3] to count_in[0] through the multiplexers MP3 to MP0 to the flip-flops FF3 to FF0. At time t2, in synchronization with rising of the clock CLK, count_in[3] to count_in[0] are latched by the flip-flops FF3 to FF0 to be output as count[3] to count[0] (count[3:0] in the drawing).

At time t3 and thereafter, the write enable signal WE becomes a low level (value "0"). Outputs of the full adders FA0 to FA3 are accordingly transmitted as count_in[3] to count_in[0] through the multiplexers MP3 to MP0 to the flip-flops FF3 to FF0. Thus, at the time t3 and thereafter, values obtained by adding "1" to the value of count[3:0] are transmitted as count_in[3] to count_in[0] to the flip-flops FF3 to FF0. The counter 110 accordingly outputs the value obtained by adding "1" to the memory 150 by using the input write data "0011" from the controller 140 as an initial value and in synchronization with the clock CLK. When the initial value is "0000", processing may be carried out by resetting the flip-flops FF0 to FF3 without using any input write data from the controller 140.

The clock transmission control circuit 130 controls whether to transmit the input clock CLK to the counter 120 according to the write enable signal WE from the controller 140 and the carry-out signal C[3] from the counter 110.

Figure 3:
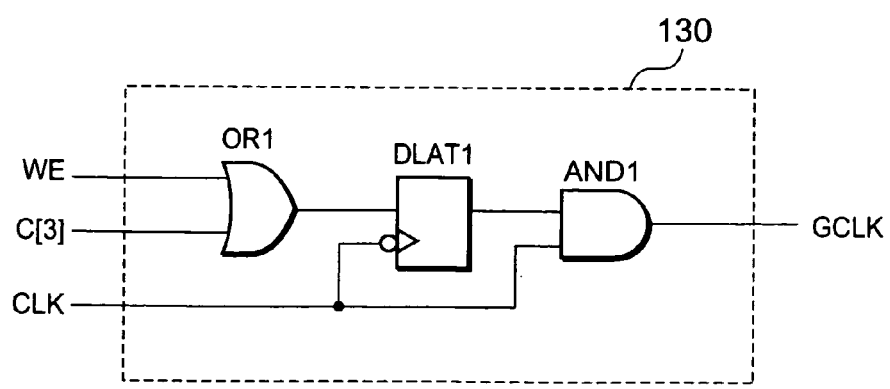
FIG. 3 illustrates a configuration of a clock transmission control circuit according to the first embodiment.

FIG. 3 illustrates a detailed configuration of the clock transmission control circuit 130. As illustrated in FIG. 3, the clock transmission control circuit 130 includes an OR circuit OR1, a D latch circuit DLAT1, and an AND circuit AND1. The D latch circuit DLAT1 latches input data when the input clock CLK is at a low level. The OR circuit OR1 receives the write enable signal WE from the controller 140 by one input and the carry-out signal C[3] from the counter 110 by the other input, and outputs a calculation result to the D latch circuit DLAT1. The D latch circuit DLAT1 latches an output from the OR circuit OR1 when the clock CLK is at a low level and outputs the value to the AND circuit AND1. The AND circuit AND1 receives the output of the D latch circuit DLAT1 by one input and the clock CLK by the other input, and outputs a calculation result as a clock GCLK to the counter 120.

Figure 4:
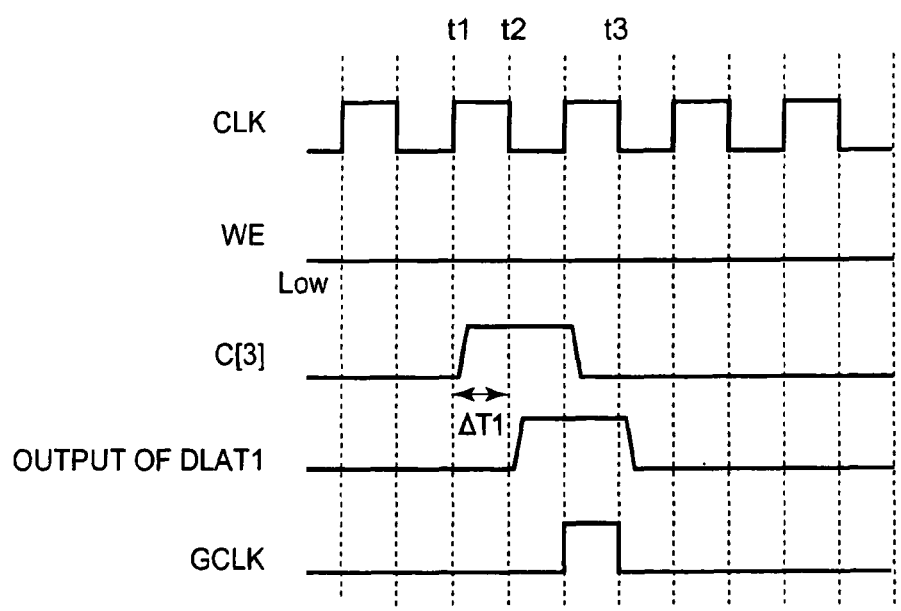
FIG. 4 is a timing chart of the clock transmission control circuit of the first embodiment.

FIG. 4 is a timing chart of an operation of the clock transmission control circuit 130. This timing chart illustrates a relationship among the write enable signal WE (low level), the carry-out signal C[3], and the clocks CLK and GCLK. As illustrated in FIG. 4, in synchronization with rising of the clock CLK at time t1, the counter 110 inputs the carry-out signal C[3] to the clock transmission control circuit 130 at a high level. At time t2, in synchronization with falling of the clock CLK, the D latch circuit DLAT1 outputs a high-level signal. While the signal output from the D latch circuit DLAT1 is at the high level, the AND circuit AND1 transmits the clock CLK as the clock GCLK to the counter 120. The signal output from the D latch circuit DLAT1 becomes a low level in synchronization with falling of the clock CLK at time t3. In other words, the clock transmission control circuit 130 transmits the clock CLK to the counter 120 only while the D latch circuit DLAT1 is at a high level. The clock transmission control circuit 130 may use a delay circuit such as an inverter chain for delaying transmission of the carry-out signal C[3] by a period ΔT1 of FIG. 4 without using the D latch circuit DLAT1. This configuration enables an operation similar to the above.

The counter 120 is a counter of a 4-bit configuration as in the case of the counter 110. A value of an output from the counter 120 is equal to upper 4 bits of an 8-bit count value count[7:0] output from the counter circuit 100, and count[7:4] is output as an output value.

The counter 120 includes flip-flops FF4 to FF7, an addition circuit 121, and multiplexers MP4 to MP7. The addition circuit 121 includes full adders FA4 to FA7. A circuitry and an operation of the counter 120 are substantially similar to those of the counter 110, and thus description thereof is omitted. A value of count[4] output from the flip-flop FF4 is a least significant bit of a 4-bit count value count[7:4], while a value of count[7] output from the flip-flop FF7 is a most significant bit of the 4-bit count value.

The clock GCLK transmitted by the clock transmission control circuit 130 is supplied to clock input terminals of the flip-flops FF7 to FF4. The multiplexers MP7 to MP4 receive upper 4 bits of the 8-bit write data output from the controller 140 by ones of their inputs. A carry-out signal C[7] output from the addition circuit 121 is stored in a flip-flop (not shown) to be used as data regarding whether or not the 8-bit output count value of the counter circuit 100 has been carried when necessary. The addition circuit 121 may be configured not to output any carry-out signal C[7].

The 8-bit output count value count[7:0] output from the counter 110 or 120 is input through an address bus to the memory 150. This output count value count[7:0] is used for designating an address of the memory 150. For example, in the counter circuit 100, because of 8 bits, addresses "00000000" to "11111111" can be designated. When 8-bit write data output from the controller 140 to the counter circuit 100 is "00000000", by using this value as an initial value, the counter circuit 100 adds "1" in synchronization with the clock CLK to perform counting-up.

Figure 5:
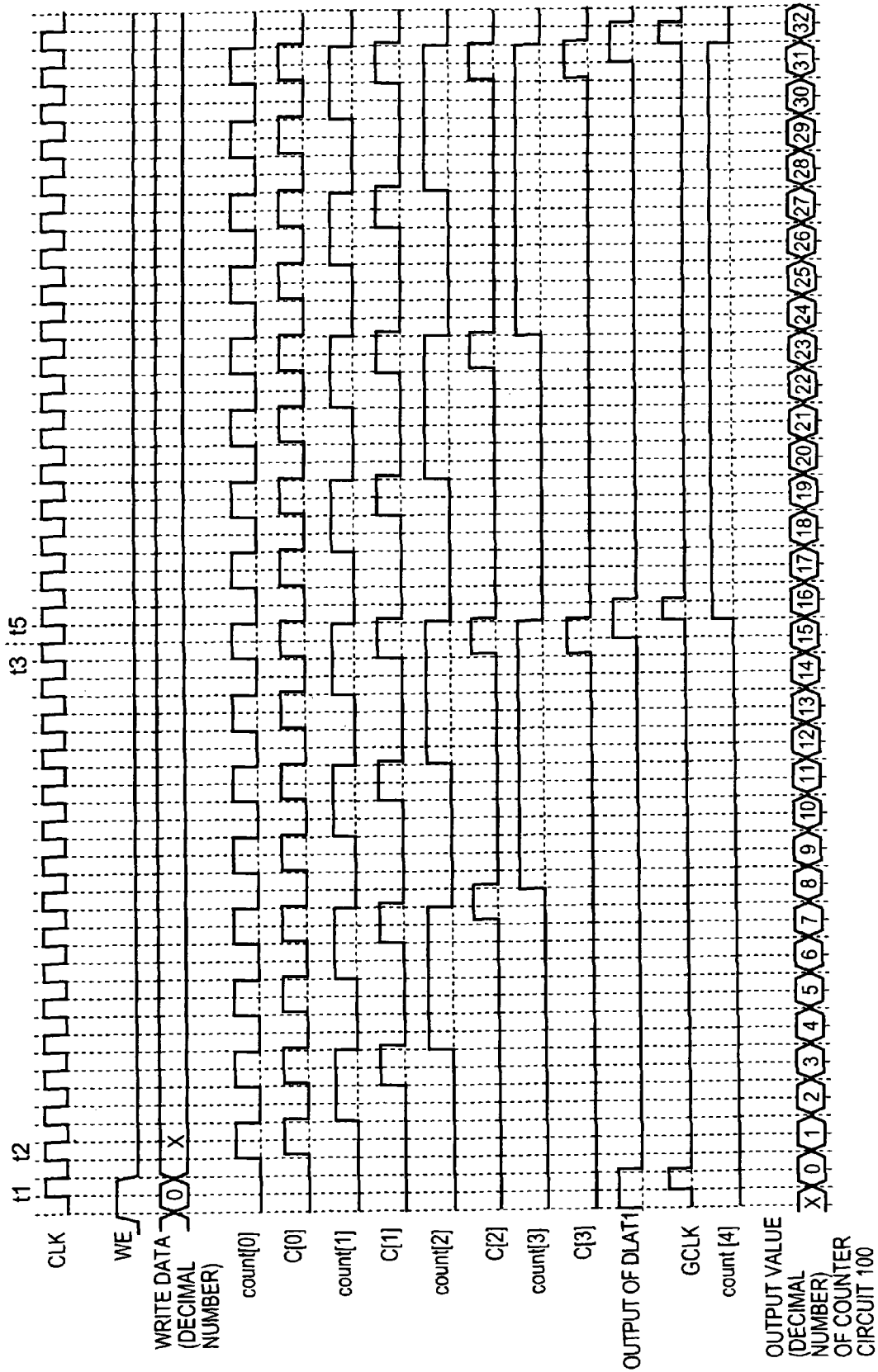
FIG. 5 is a timing chart of the counter circuit of the first embodiment.

Next, such an operation of the counter circuit 100 as described above is described. FIG. 5 is a timing chart of the counter circuit 100. It is presumed that a value "00000000" (decimal number "0") has been input as an initial value for write data input from the controller 140. To simplify the drawing, 8-bit write data and an output value of the counter circuit 100 are represented by decimal numbers.

First, when the write enable signal WE is at a high level, write data "00000000" (decimal number "0") is input to the counter circuit 100. In this case, a lower 4-bit value input to the counter 110 is "0000", and a value of count_in[3:0] is "0000". Similarly, an upper 4-bit value input to the counter 120 is "0000", and a value of count_in[7:4] is "0000". An output of the D latch circuit DLAT1 of the clock transmission control circuit 130 is at a high level.

At time t1, in synchronization with rising of the clock CLK, the flip-flops FF3 to FF0 of the counter 110 latch count_in[3] to count_in[0] to output count[3] to count[0]. A value of count[3:0] is "0000" in this case. Because of the high level of the output of the D latch circuit DLAT1, the clock CLK has been output as GCLK from the clock transmission control circuit 130. Thus, in synchronization with rising of the clock GCLK, the flip-flops FF7 to FF4 of the counter 120 latch count_in[7] to count_in[4] to output count[7] to count[4]. A value of count[7:4] is "0000" in this case.

Thereafter, from time t2 to time t3, the write enable signal WE becomes a low level. In synchronization with rising of the clock CLK, the counter 110 outputs values obtained by adding "1" as count[3] to count[0]. On the other hand, in the counter 120, because of the low level of the write enable signal WE, no rising of the clock GCLK is input, and the output value count[7:4] is maintained at "0000".

At the time t3, in synchronization with rising of the clock CLK, the output value count[3:0] becomes "1111". Simultaneously, in synchronization with rising of the clock CLK, the addition circuit 111 outputs a carry-out signal C[3] of a high level (value of "1") to the clock transmission control circuit 130. The high-level carry-out signal C[3] is input through the OR circuit OR1 to the D latch circuit DLAT1. Because of the high level of the carry-out signal C[3], the D latch circuit DLAT1 outputs a signal of a high level to the AND circuit AND1 simultaneously with falling of the clock CLK at time t4. While the output from the D latch circuit DLAT1 is at the high level, the clock CLK is input as the clock GCLK to the counter 120. Thus, in synchronization with rising of the clock GCLK at time t5, the counter 120 outputs values obtained by adding "1" to the values count_in[7] to count_in[4] as count[7] to count[4]. Then, until rising of a next clock GCLK is input, current output values are held. Thereafter, the counters 110 and 120 repeat similar operations, and an output value of the counter circuit 100 is counted up by 1 in synchronization with rising of the clock CLK.

In short, the clock CLK is transmitted to the counter 120 according to the carry-out signal C[3] from the counter 110. This carry-out signal C[3] becomes a high level only when the value of count[3:0] is "1111". In other words, the clock CLK is input to the counter 110 by sixteen times, and the number of outputting times of the clock CLK as a high-level clock among the sixteen times is only one. The number of transmitting times of the clock CLK to the counter 120 based on the carry-out signal C[3] is accordingly only one among the sixteen times. Thus, as compared with rising of the clock CLK input to the counter 110, rising of the clock GCLK input to the counter 120 is only ¹⁄₁₆. This means that an operation based on the input clocks of the flip-flops FF7 to FF4 of the counter 120 is reduced by ¹⁄₁₆ as compared with the case where the clock CLK is always input. As a result, in the counter 120, power consumption of the flip-flops driven by signal transition of rising and falling of the input clock can be reduced.

Thus, in the counter circuit 100 of this embodiment, an operation rate of the counter 120 for counting upper bits of the 8-bit output count value is reduced by ¹⁄₁₆ as compared with an operation rate of the counter 110 for counting lower bits. As a result, power consumption of the counter circuit 100 can be reduced. The operation rate means a probability of operations of the flip-flops of the counters based on signal transition of rising and falling of the input clock.

According to the first embodiment, the memory uses the counter circuit as an address counter. However, the counter circuit can be used as a program counter. The counter circuit can be used as a mobile phone interruption request monitoring counter. Generally, the interruption request monitoring counter circuit is required to always operate as a circuit for checking whether or not there is an interruption at each fixed time during standby time of a device such as a mobile phone. Thus, in a device such as a mobile phone or a PDA required to reduce power consumption, lower power consumption of the counter circuit is important. The counter circuit 100 of this embodiment provides a great effect of reducing power consumption.

The counters 110 and 120 of the first embodiment both have configurations of 4-bit counters. However, the counters are not limited to these configurations. For example, the counters can be 8-bit or 16-bit counters. The counter circuit may be configured by combining counters different in bit width, for example, a 6-bit counter 110 and an 8-bit counter 120. The counters 110 and 120 are addition counters for adding "1". However, the counters 110 and 120 may be configured as subtraction counters for subtracting "1".

Figure 6:
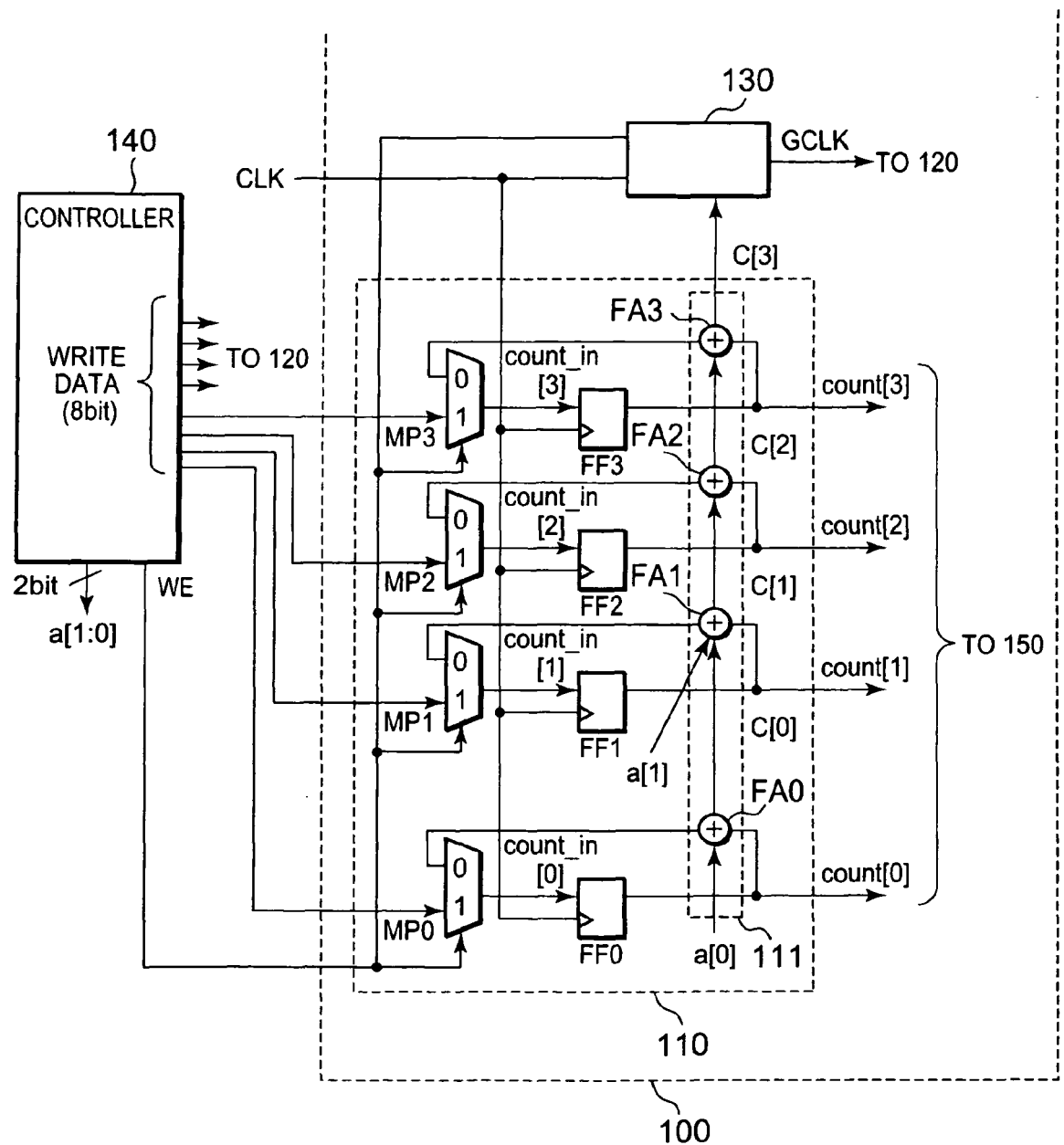
FIG. 6 illustrates the configuration of the counter circuit of the first embodiment.
Figure 7:
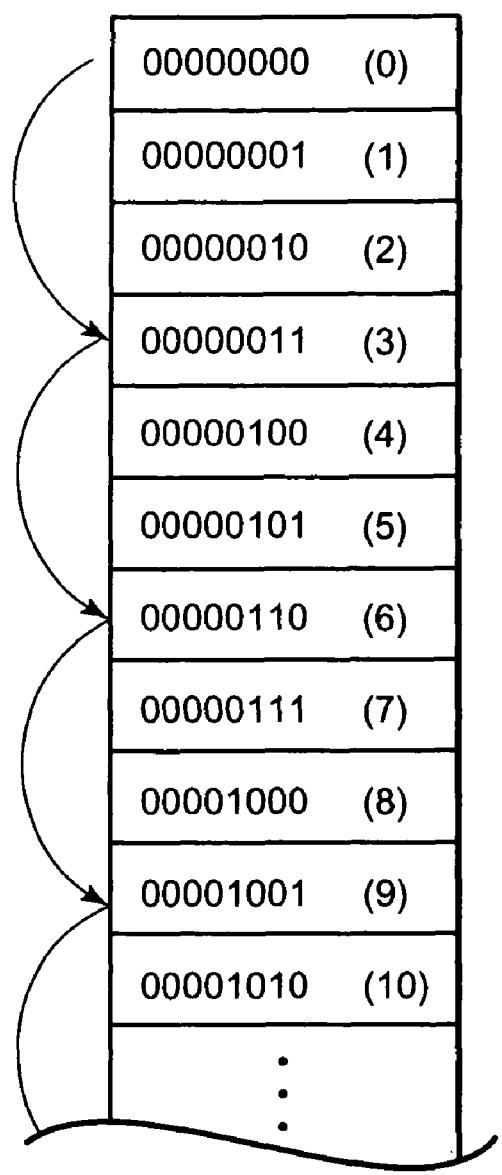
FIG. 7 illustrates a relationship between an output count value of the counter circuit and an address of a memory according to the first embodiment.

According to this embodiment, only "1" is added to perform counting-up. However, numerical values other than "1" may be used for counting-up. For example, as illustrated in FIG. 6, the addition circuit 111 may add a 2-bit value a[1:0] output from the controller 140 to perform counting-up. As illustrated in FIG. 6, the addition circuit 111 adds a[0] which is a lower bit of the 2-bit value a[1:0] to the full adder FA0, and a[1] which is an upper bit to the full adder FA1. When a[1:0] is "10" (decimal number "2"), a decimal number "2" is added to an output count value of the counter circuit 100 for counting-up. When a[1:0] is "11" (decimal number "3"), a decimal number "3" is added for counting-up. For example, as illustrated in FIG. 7, when a[1:0] is "11" (decimal number "3") and an initial value of write data is "0" (decimal number), a count of a memory address can be advanced by "3, 6, 9, ..." (decimal numbers).

Thus, in the counter 110, by making variable a value added by the addition circuit 111, the value can be used for address control such as burst transfer of the memory 150. Setting of the value to be added is not limited to the 2-bit value as described above. A k bit width of more bits can be set. In this case, the counter 110 has to be configured as a counter of at least k+1 bit width.

Second Embodiment

Referring to the drawing, a specific second embodiment of the present invention is described below in detail. In the second embodiment, the present invention is applied to a 12-bit counter circuit 200.

Figure 8:
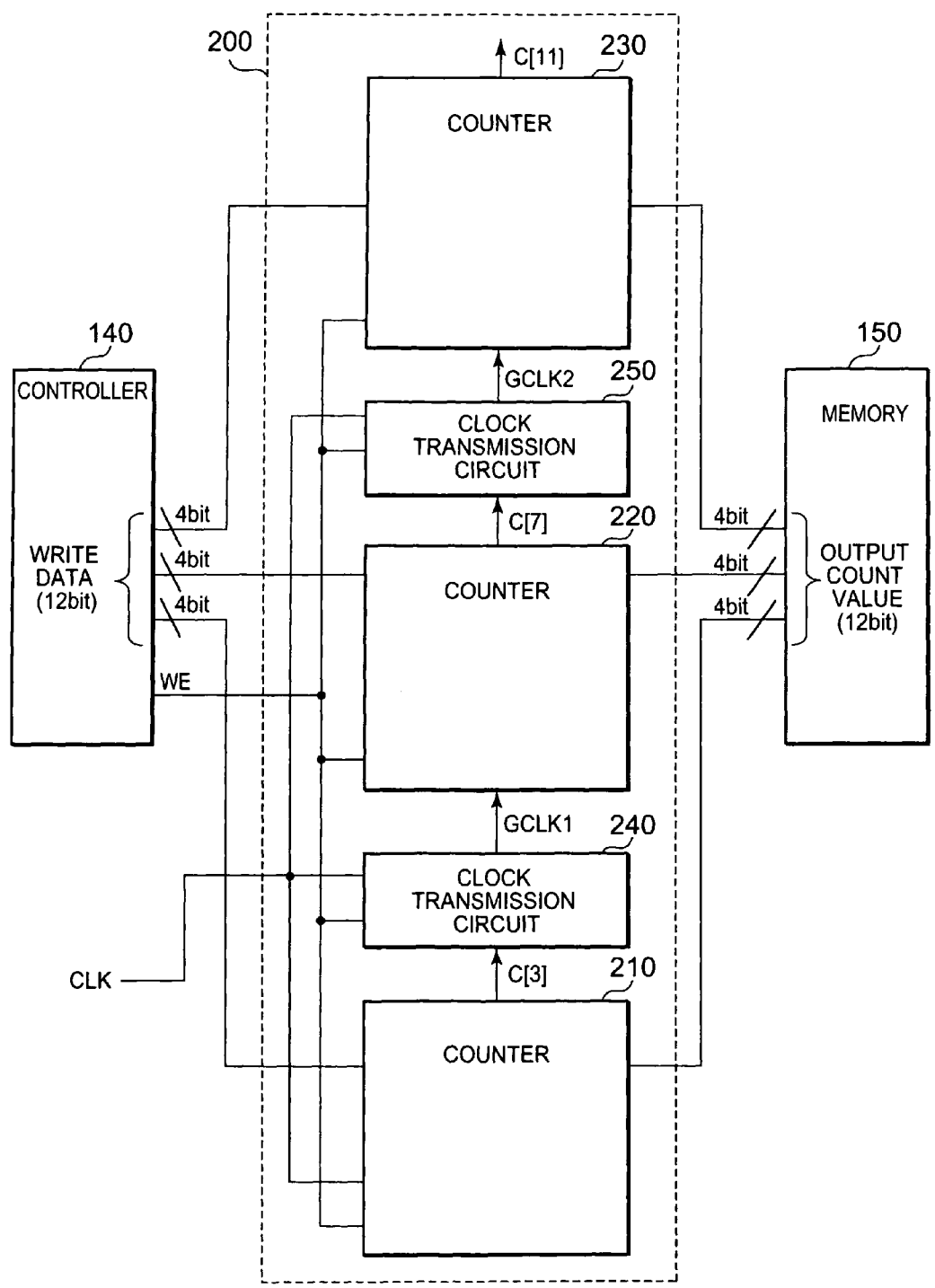
FIG. 8 illustrates a configuration of a counter circuit according to a second embodiment.

FIG. 8 illustrates an example of a configuration of the counter circuit 200 according to the second embodiment. As illustrated in FIG. 8, the counter circuit 200 includes counters 210, 220 and 230, and clock transmission circuits 240 and 250. The counters 210, 220 and 230 have 4-bit counter configurations substantially similar to that of the counter 110 or 120 of the first embodiment, and thus detailed description thereof is omitted.

Lower 4 bits, intermediate 4 bits, and upper 4 bits of 12-bit write data output from a controller 140 are respectively input to the counters 210, 220 and 230. Similarly, the counters 210, 220 and 230 output lower 4 bits count[3] to count[0], intermediate 4 bits count[7] to count[4], and upper 4 bits count[11] to count[8] of a 12-bit output count value output to a memory 150. The counters 210, 220 and 230 respectively output C[3], C[7] and C[11] as carry-out signals. The carry-out signal C[11] is stored in a flip-flop (not shown) to be used as data on whether or not the 12-bit output count value of the counter circuit 200 has been carried when necessary. The counter 230 may be configured not to output any carry-out signal C[11].

The clock transmission circuits 240 and 250 are substantially similar in configuration to that of the clock transmission control circuit 130 of the first embodiment, and thus detailed description thereof is omitted. The carry-out signal C[3] from the counter 210 is input to the clock transmission circuit 240, and the carry-out signal C[7] from the counter 220 is input to the clock transmission circuit 250. The clock transmission circuit 240 transmits a clock CLK as GCLK1 to the counter 220 according to the carry-out signal C[3]. Similarly, the clock transmission circuit 250 transmits the clock CLK as GCLK2 to the counter 230 according to the carry-out signal C[7]. Relationships between the carry-out signal C[3] and the clock GCLK1 and between the carry-out signal C[7] and the clock GCLK2 are substantially similar to that between the carry-out signal C[3] and the clock GCLK of the first embodiment, and thus description of an operation of the counter circuit 200 is omitted.

With this configuration, in the counter circuit 200, an operation rate of the counter 220 for counting intermediate bits of the 12-bit output count value is reduced to 1/16 as compared with that of the counter 210 for counting lower bits, and an operation rate of the counter 230 for counting upper bits is reduced to 1/256 as compared with that of the counter 210 for counting the lower bits. Thus, by dividing the output count value every 4 bits, and finely controlling a clock input to the counter which is in charge of the upper bits, power consumption of the counter circuit can further be reduced.

In the counter circuit 200 of the second embodiment, the 12-bit count value is divided into three, that is, among the 4-bit counters 210, 220 and 230. However, the 12-bit count value may be divided more finely among a plurality of counters. In this case, a plurality of clock transmission circuits has accordingly to be provided.

Third Embodiment

Referring to the drawings, a specific third embodiment of the present invention is described below in detail. In the third embodiment, as in the first embodiment, the present invention is applied to an 8-bit counter circuit 300. The counter circuit 300 is different from the counter circuit 100 of the first embodiment in that a controller 140 further outputs an enable signal Enable, and control is performed to stop a clock operation of the counter circuit 300 based on this signal. Thus, only the difference is described below.

Figure 9:
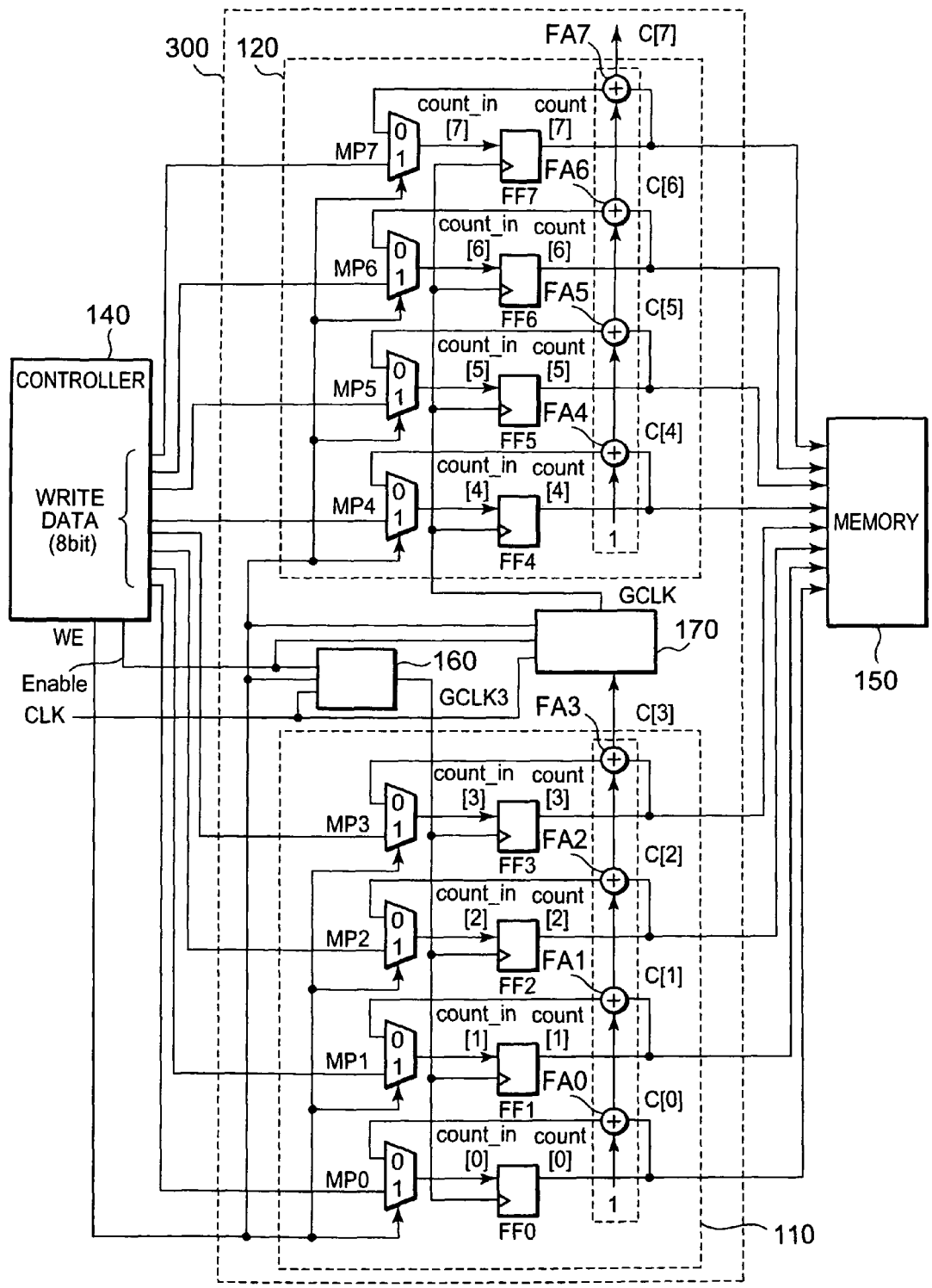
FIG. 9 illustrates a configuration of a counter circuit according to a third embodiment.

FIG. 9 illustrates an example of a configuration of the counter circuit 300 according to the third embodiment. As illustrated in FIG. 9, the counter circuit 300 includes counters 110 and 120, and clock transmission control circuits 160 and 170. The counters 110 and 120 have already been described in the first embodiment, and thus description thereof is omitted.

Figure 10:
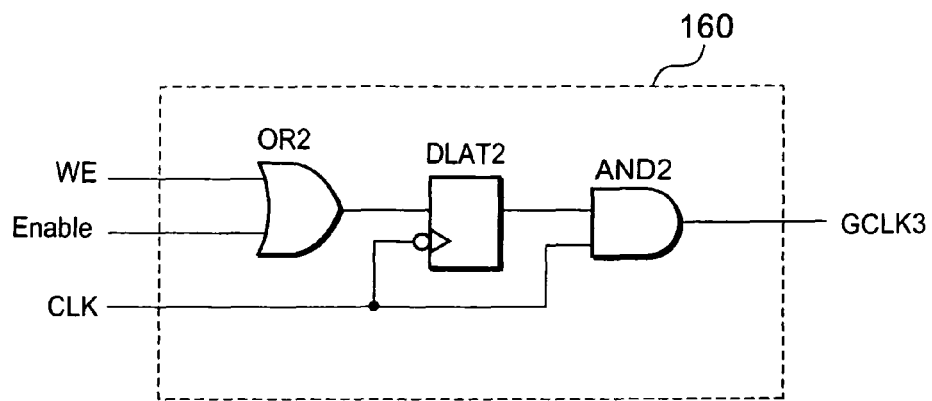
FIG. 10 illustrates a configuration of a clock transmission control circuit according to the third embodiment.

FIG. 10 illustrates a detailed circuitry of the clock transmission control circuit 160. As illustrated in FIG. 10, the clock transmission control circuit 160 includes an OR circuit OR2, a D latch circuit DLAT2, and an AND circuit AND2. The D latch circuit DLAT2 latches input data when a clock CLK to be input is at a low level.

The OR circuit OR2 receives a write enable signal WE from the controller 140 by one input and the enable signal Enable by the other input, and outputs a calculation result to the D latch circuit DLAT2. The D latch circuit DLAT2 latches an output from the OR circuit OR2 when the clock CLK is at a low level to output the value to the AND circuit AND2. The AND circuit AND2 receives an output of the D latch circuit DLAT2 by one input and the clock CLK by the other input, and outputs a calculation result as a clock GCLK3 to the counter 110.

As can be understood from the circuitry illustrated in FIG. 10, when the enable signal Enable is at a low level, the clock GCLK3 is also at a low level. Thus, the counter 110 holds a current value without performing any clock operation. When the enable signal Enable is at a high level, the clock CLK is transmitted as GCLK3 to the counter 110, and the counter 110 starts a clock operation.

Figure 11:
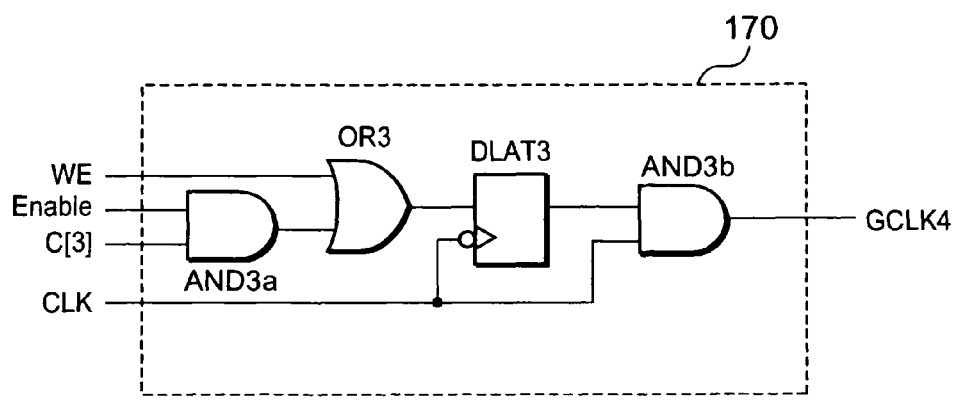
FIG. 11 illustrates a configuration of another clock transmission control circuit according to the third embodiment.

FIG. 11 illustrates a detailed circuitry of a clock transmission control circuit 170. As illustrated in FIG. 11, the clock transmission control circuit 170 includes an OR circuit OR3, a D latch circuit DLAT3, and AND circuits AND3a and AND3b. The D latch circuit DLAT3 latches input data when the clock CLK to be input is at a low level.

The AND circuit AND3a receives the enable signal Enable by one input and a carry-out signal C[3] by the other input, and outputs a calculation result to the OR circuit OR3. The OR circuit OR3 receives the write enable signal WE by one input and an output of the AND circuit AND3a by the other input, and outputs a calculation result to the D latch circuit DLAT3. The D latch circuit DLAT3 latches an output from the OR circuit OR3 when the clock CLK is at a low level to output the value to the AND circuit AND3b. The AND circuit AND3b receives an output of the D latch circuit DLAT3 by one input and the clock CLK by the other input, and outputs a calculation result as a clock GCLK4 to the counter 120.

As can be understood from the circuitry illustrated in FIG. 11, when the enable signal Enable is at a low level, the clock GCLK4 is also at a low level. Thus, the counter 120 holds a current value without performing any clock operation. When the enable signal Enable is at a high level, the clock CLK is transmitted as GCLK4 to the counter 120 according to the carry-out signal C[3], and the counter 120 starts a clock operation.

Figure 12:
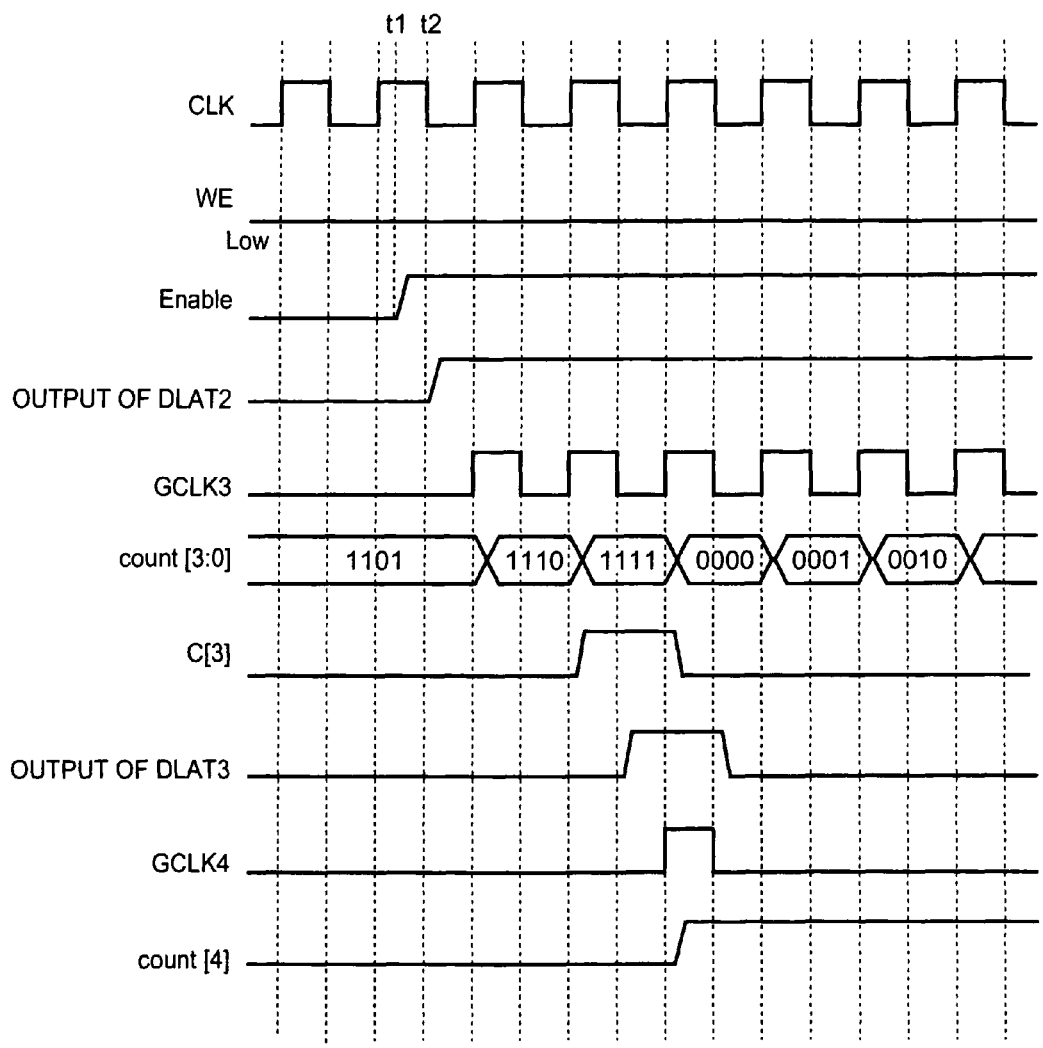
FIG. 12 is a timing chart of the counter circuit of the third embodiment.

Next, such an operation of the counter circuit 300 as described above is described. FIG. 12 is a timing chart of the counter circuit 300. As can be understood from FIG. 12, until time t1, the enable signal Enable is at a low level, and an output of the D latch circuit DLAT2 of the clock transmission control circuit 160 is also at a low level. As a result, the clock GCLK3 which is an output of the clock transmission control circuit 160 is at a low level, and no clock CLK is accordingly transmitted to the counter 110. Thus, the counter 110 performs no clock operation, and an output count value count[3:0] of the counter 110 is held.

In the clock transmission control circuit 170, because of the low level of the enable signal Enable until the time t1, an output of the AND circuit AND3a becomes a low level irrespective of a value of the carry-out signal C[3]. As in the case of the clock transmission control circuit 160, an output of the D latch circuit DLAT3 therefore becomes a low level. As a result, the clock GCLK4 that is an output from the clock transmission control circuit 170 is at a low level, and no clock CLK is transmitted to the counter 120. Thus, an output count value count[7:4] of the counter 120 which is in charge of an output of upper bits is held.

When the enable signal Enable becomes a high level at the time t1, the output of the D latch circuit DLAT2 of the clock transmission control circuit 160 becomes a high level at time t2. As a result, from the time t2, the clock CLK is transmitted from the clock transmission control circuit 160. Thus, the counter 110 starts a clock operation, and the output count value count[3:0] of the counter 110 is counted up.

Similarly, in the clock transmission control circuit 170, when the enable signal Enable becomes a high level at the time t1, the output of the AND circuit AND3a becomes a high level according to a value of the carry-out signal C[3]. From the time t2, the output of the D latch circuit DLAT3 becomes a high level according to the value of the carry-out signal C[3]. Thereafter, an operation is similar to that of the clock transmission control circuit 130 of the first embodiment. Thus, at the time t2 and thereafter, the clock CLK is transmitted from the clock transmission control circuit 170 according to the value of the carry-out signal C[3]. As a result, the output count value count[7:4] of the counter 120 which is in charge of an output of upper bits is counted up by an operation similar to that of the first embodiment.

With this configuration, in the counter circuit 300, whether to perform a clock operation is controlled based on the enable signal Enable. Thus, the use of the enable signal Enable enables fine control of the clock operation of the counter circuit 300. Thus, power consumption of the counter circuit 300 can be optimized to realize further power saving. When the clock CLK for operating the counter circuit 300 is faster in cycle than a clock for operating a memory 150, the clock cycle difference can be adjusted by the counter circuit 300.

Fourth Embodiment

Referring to the drawings, a specific fourth embodiment of the present invention is described below in detail. In the fourth embodiment, as in the third embodiment, the present invention is applied to an 8-bit counter circuit 400. The counter circuit 400 is different from the counter circuit 300 of the third embodiment in control means for a clock input to a counter 120. Thus, only the difference is described below.

Figure 13:
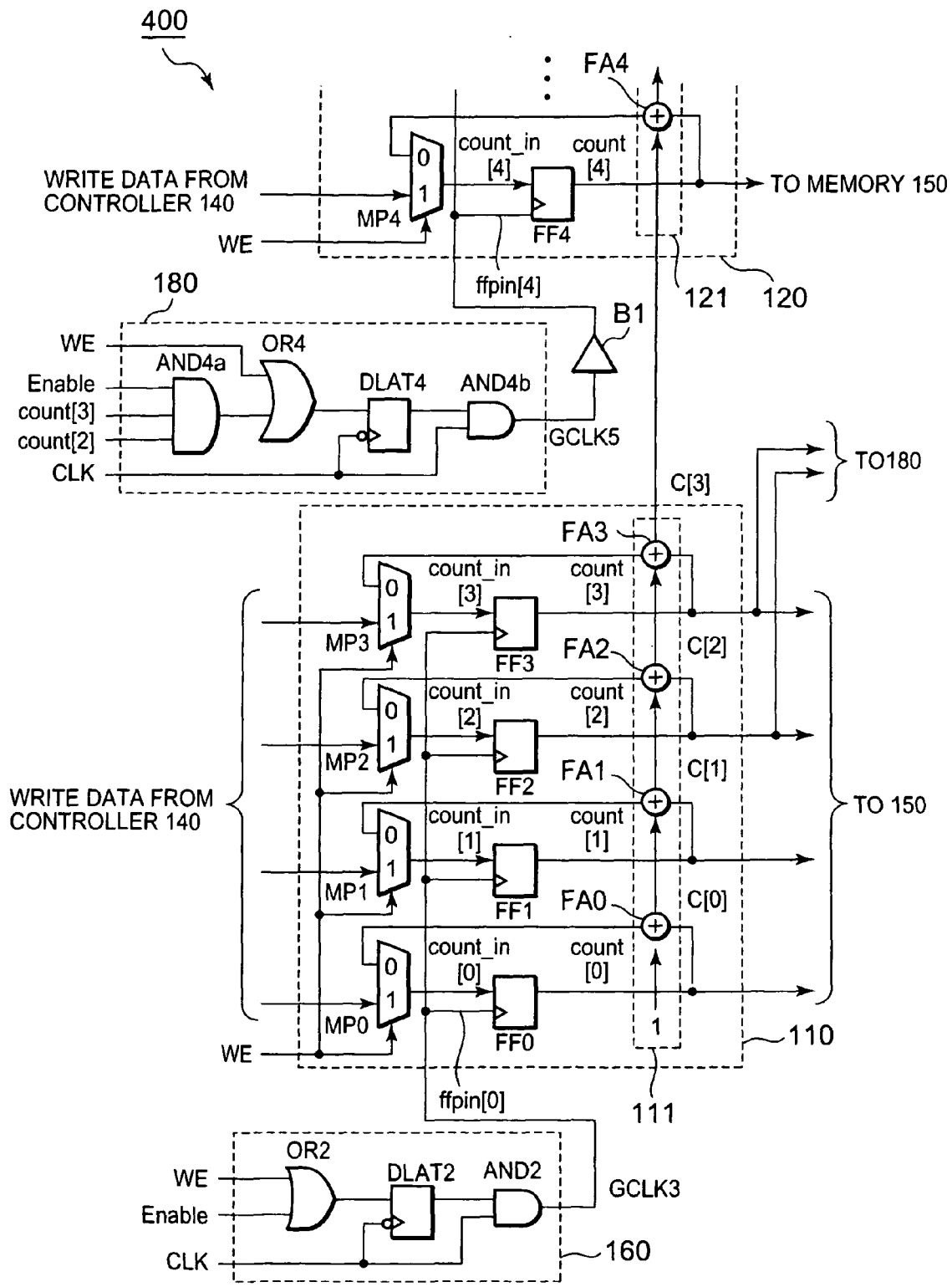
FIG. 13 illustrates a configuration of a counter circuit according to a fourth embodiment.

FIG. 13 illustrates an example of a configuration of the counter circuit 400 according to this embodiment. As illustrated in FIG. 13, the counter circuit 400 includes counters 110 and 120, clock transmission control circuits 160 and 180, and a CTS buffer B1. The counters 110 and 120 and the clock transmission control circuit 160 have been described in the third embodiment, and thus description thereof is omitted. A carry-out signal C[3] output from the counter 110 is input to a full adder FA4 of the counter 120. The full adder FA4 outputs a value obtained by adding a value of the carry-out signal C[3] to count[4], and a carry-out signal C[4]. The output count[3:2] of flip-flops FF3 and FF2 of the counter 110 is output to the clock transmission control circuit 180 in addition to a memory 150. A clock that the counter 120 receives is an output from the CTS buffer B1.

As illustrated in FIG. 13, the clock transmission control circuit 180 includes an AND circuit AND4a, an OR circuit OR4, a D latch circuit DLAT4, and an AND circuit AND4b.

The AND circuit AND4a receives count[3], count[2], and an enable signal Enable, and outputs a calculation result to the OR circuit OR4. The OR circuit OR4 receives a write enable signal WE from a controller 140 and an output from the AND circuit AND4a, and outputs a calculation result to the D latch circuit DLAT4. The D latch circuit DLAT4 latches an output from the OR circuit OR4 when a clock CLK is at a low level, and outputs the value to the AND circuit AND4b. The AND circuit AND4b receives the output of the D latch circuit DLAT4 and the clock CLK, and outputs a calculation result as a clock GCLK5 to the CTS buffer B1.

The OR circuit OR4, the D latch circuit DLAT4, and the AND circuits AND4a and AND4b of the clock transmission control circuit 180 are similar in configuration to the OR circuit OR3, the D latch circuit DLAT3, and the AND circuits AND3a and AND3b of the clock transmission control circuit 170 of the third embodiment. Thus, a substantial difference of the clock transmission control circuit 180 from the clock transmission control circuit 170 is that the carry-out signal C[3] is replaced by a calculation result of the AND circuit AND4a which receives count[3:2].

The CTS buffer B1 is a clock tree synthesis buffer (referred to as CTS buffer hereinafter) for matching timings between a clock input to a plurality of flip-flops of the counter 110 and a clock input to a plurality of flip-flops of the counter 120. The CTS buffer B1 delays the clock GCLK5 from the clock transmission control circuit 180 for matching the clock GCLK5 with a timing of a clock GCLK3 to output the clock GCLK5 to the counter 120.

Figure 14:
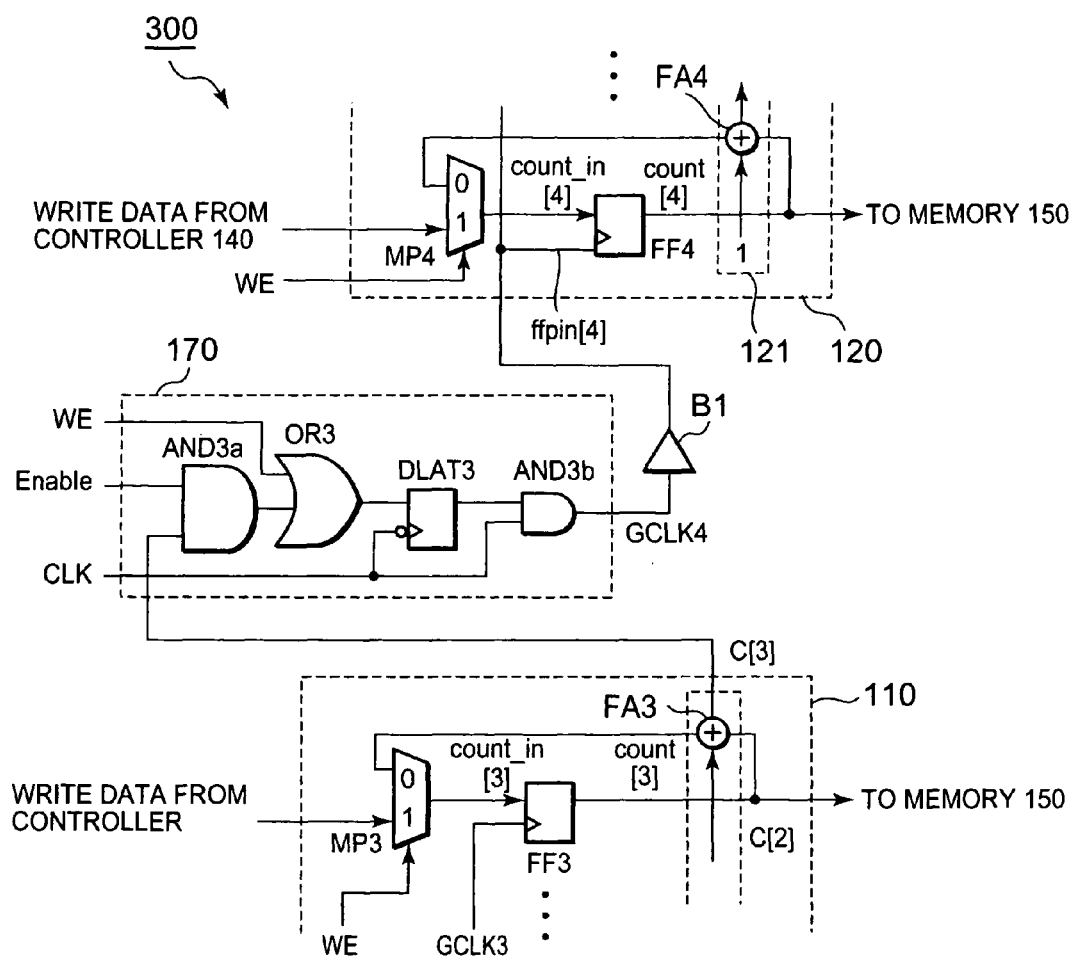
FIG. 14 illustrates an effect of the counter circuit of the fourth embodiment.

To describe effects of the fourth embodiment, FIG. 14 illustrates a configuration where a CTS buffer is inserted between the clock transmission control circuit 170 and the counter 120 in the counter circuit 300 of the third embodiment. When the CTS buffer is inserted between the clock transmission control circuit 170 and the counter 120, a timing of an I/O signal of the D latch circuit DLAT3 becomes strict. It is because logic of the carry-out signal C[3] necessitates generation of an output count[0] of the flip-flop FF0 through the full adders FA0 to FA3. Thus, seen from the output of the flip-flop FF0, a fan-out number is large, and a signal delay of the carry-out signal C[3] is large. The carry-out signal C[3] is input through the AND circuit AND3a and the OR circuit OR3 to the D latch circuit DLAT3. Thus, when delay conditions are strict, a clock failure may occur in the counter circuit 300 (refer to FIG. 16).

Figure 15:
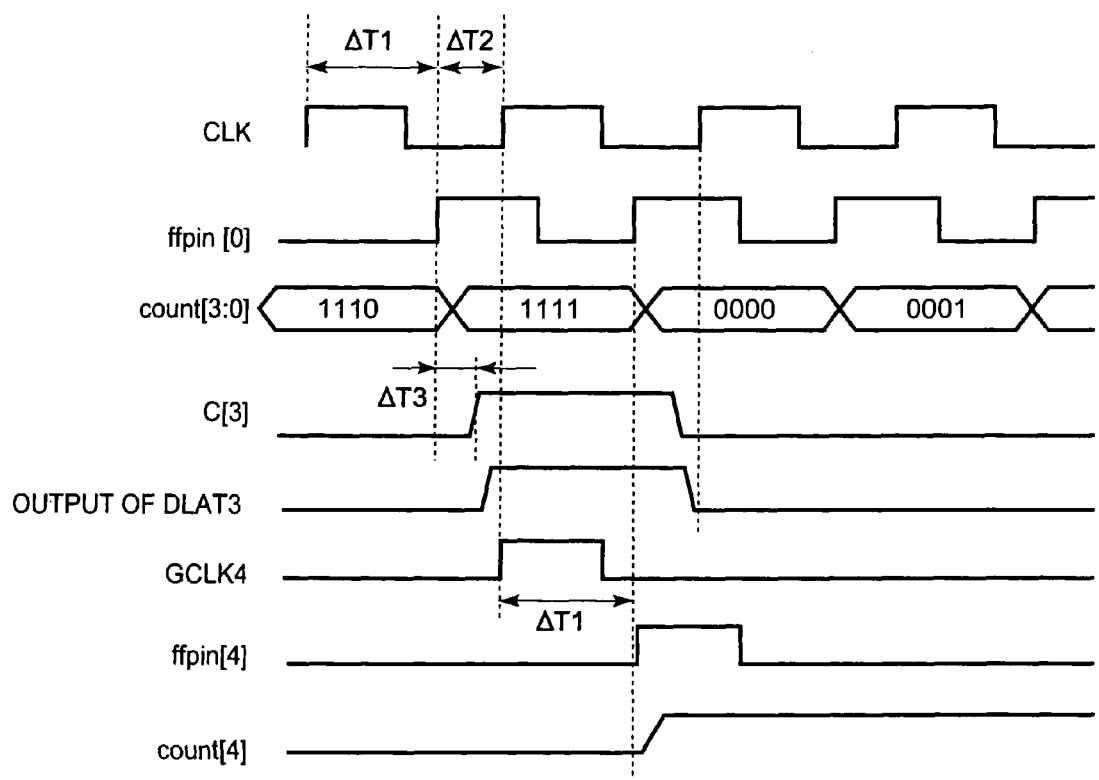
FIG. 15 illustrates an effect of the counter circuit of the fourth embodiment.

A timing chart of the counter circuit 300 when delay conditions are strict in the circuitry of FIG. 14 is illustrated in FIG. 15. In the drawing, ffpin[0] and ffpin[4] are clock signals respectively input to clock input terminals of the flip-flops FF0 and FF4. Regarding the strict delay conditions, it is presumed that ffpin[0] is input to the flip-flop FF0 with a delay of ΔT1 with respect to the clock CLK.

Figure 16:
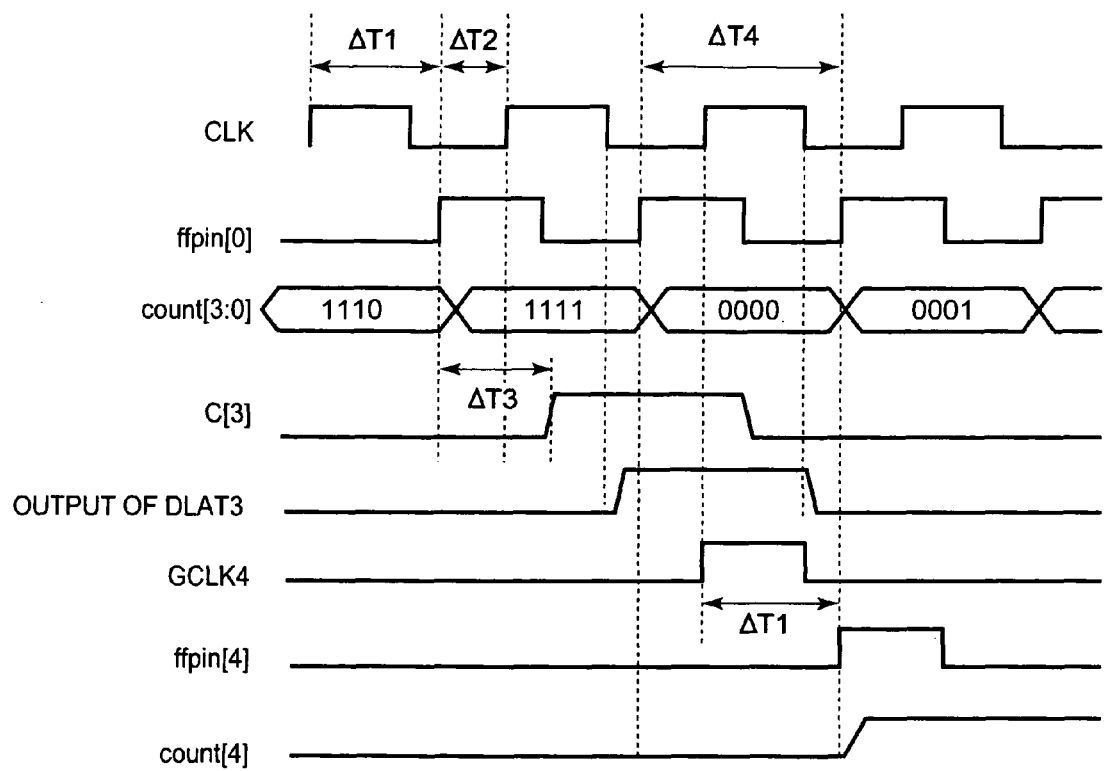
FIG. 16 illustrates an effect of the counter circuit of the fourth embodiment.

First, fundamentally, as illustrated in FIG. 15, even when delay conditions of a clock are strict, there is no problem as long as a delay ΔT3 of a high-level carry-out signal C[3] is within a period of ΔT2. However, when the delay ΔT3 of the carry-out signal C[3] is longer even slightly than the period of ΔT2 as illustrated in FIG. 16, count[4] becomes not a high level (value of "1") but a low level (value of "0") during a period of ΔT4. In this case, there occurs a problem that no correct output count value is output from the counter circuit 300. As a result, under such conditions, the configuration of the counter circuit 300 of the third embodiment cannot deal with the problem.

However, in the case of the counter circuit 400 of the fourth embodiment, the clock GCLK5 output from the clock transmission control circuit 180 is generated not based on the carry-out signal C[3] but based on a logical conjunction (AND) of count[3] and count[2] (count[3:2]).

Figure 17:
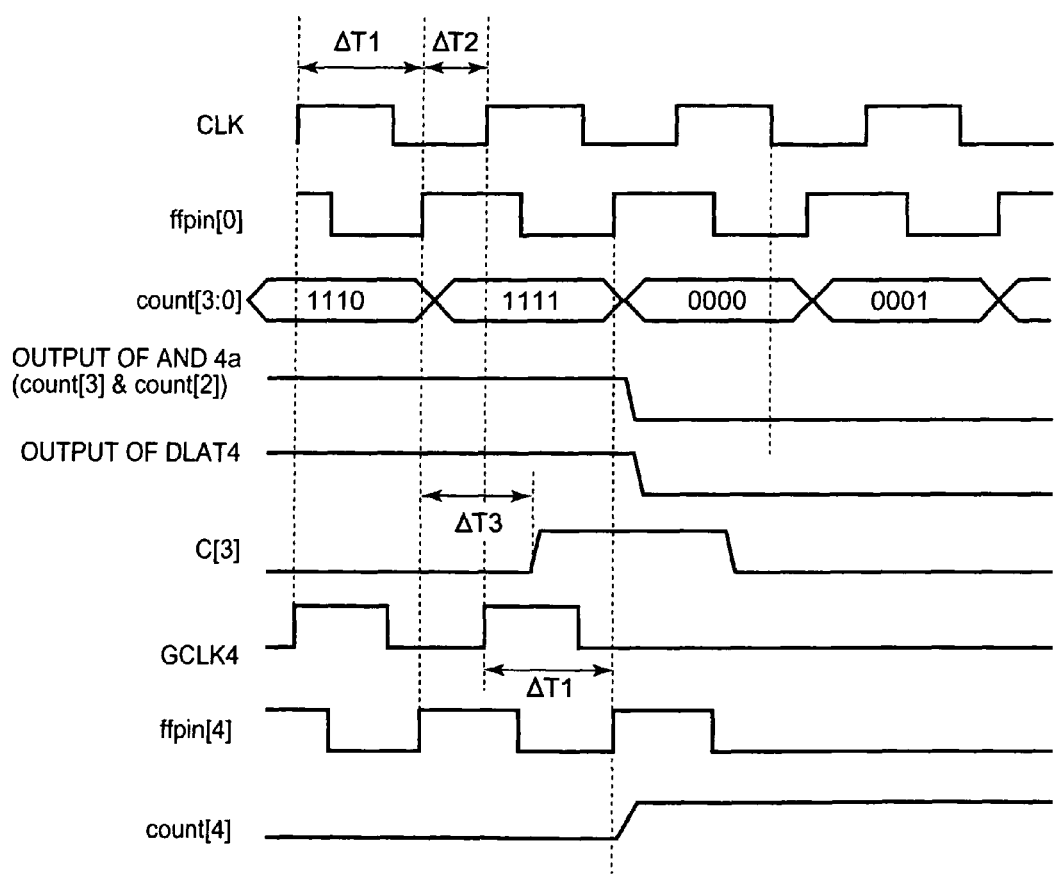
FIG. 17 is a timing chart of the counter circuit of the fourth embodiment.
Figure 18:
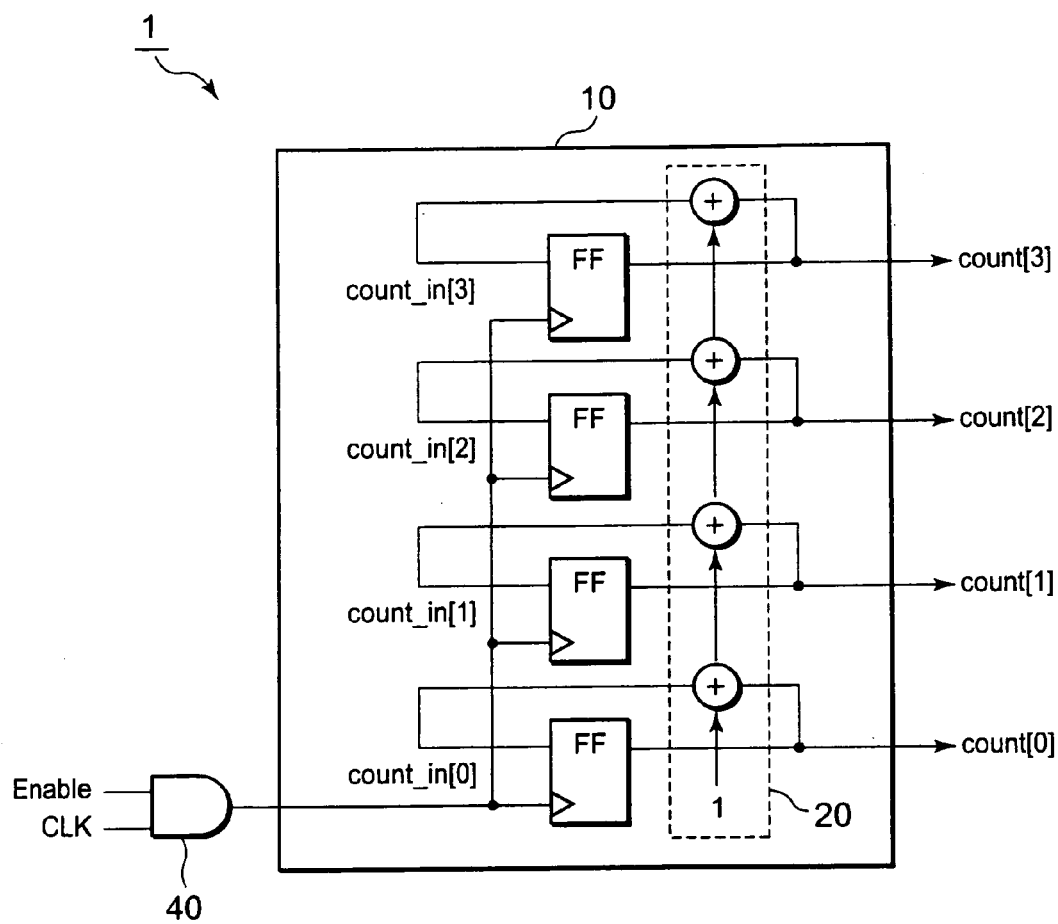
FIG. 18 illustrates a configuration of a conventional counter circuit.

FIG. 17 is a timing chart of an operation of the counter circuit 400. As illustrated in FIG. 17, even when a delay ΔT3 of the carry-out signal C[3] is larger than a period of ΔT2, count[3:2] has been set to a value "11", and hence a signal input to the D latch circuit DLAT4 is at a high level. Thus, the clock CLK is transmitted as GCLK5, preventing the abovementioned problem. The clock GCLK5 is delayed by ΔT1 by the CTS buffer B1 to be input to the input terminal of the flip-flop such as ffpin[4].

As described above, even when the delay conditions are strict because of the insertion of the CTS buffer, power consumption of the counter circuit 400 can be reduced without any clock failure. However, in the fourth embodiment, when the value of count[3:2] is "11", the clock CLK is transmitted to the counter 120. Thus, unlike the first to third embodiments, the clock operation of the counter 120 of upper bits is not completely limited.

The present invention is not limited to the embodiments described-above. Changes can appropriately be made without departing from the spirit and scope of the present invention. For example, in the embodiments described above, the counter circuit is connected outside the controller. However, the counter circuit may be connected inside the controller. The memory uses the counter circuit as the address counter. However, the counter circuit can be used as a program counter.

It is apparent that the present invention is not limited to the above embodiments, but may be modified and changed without departing from the scope and spirit of the invention.

What is claimed is:

1. A counter circuit adding a first value indicated by a plurality of bits and a second value in response to a clock signal, a first part of said plurality of bits being lower than a second part of said plurality of bits, said counter circuit comprising:
a first counter adding said first part of said plurality of bits and said second value in response to said clock signal to output a third value regarding a result of adding said first and said second values;
a second counter adding said second part of said plurality of bits and a fourth value indicated by a carry-out signal from said first counter in response to said clock signal; and
a clock transmission control circuit coupled to said first and second counters and receiving said clock signal and said third value to control whether or not to supply said clock signal to said second counter in accordance with said received third value.

2. The counter circuit according to claim 1, wherein said third value is said fourth value.

3. The counter circuit according to claim 1, wherein said third value is indicated by a part of bits representing a result of adding said first part of said plurality of bits and said second value.

4. The counter circuit according to claim 1, further comprising: another clock transmission control circuit coupled to said first counter and receiving said clock signal and an enable signal to control whether or not to supply said clock signal to said first counter in accordance with said received enable signal.

5. The counter circuit according to claim 1, further comprising: a third counter adding a third part of said plurality of bits and a fifth value indicated by another carry-out signal from said second counter in response to said clock signal, said third part of said plurality of bits being higher than said second part of said plurality of bits.

6. The counter circuit according to claim 2, wherein said clock transmission control circuit includes an OR gate receiving said carry-out signal, a latch circuit coupled to said OR gate to receive said an output of said OR gate and said clock signal, and an AND gate coupled to said latch circuit to receive an output of said latch circuit and said clock signal.

7. The counter circuit according to claim 3, wherein said clock transmission control circuit includes an AND gate receiving said third value, an OR gate coupled to said AND gate to receive an output of said AND gate, a latch circuit coupled to said AND gate to receive an output of said OR gate and said clock signal, and another AND gate coupled to said latch circuit to receive an output of said latch circuit and said clock signal.

8. The counter circuit according to claim 4, wherein said another clock transmission control circuit includes an OR gate receiving said enable signal, a latch circuit coupled to said OR gate to receive an output of said OR gate and said clock signal, and an AND gate coupled to said latch circuit to receive an output of said latch circuit and said clock signal.

9. The counter circuit according to claim 4, wherein said clock transmission control circuit includes an AND gate receiving said enable signal and said carry-out signal, and OR gate coupled to said AND gate to receive an output of said OR gate and said clock signal, a latch circuit coupled to said OR gate to receive an output of said OR gate and said clock signal, and another AND gate coupled to said latch circuit to receive an output of said latch circuit and said clock signal.

* * * * *